United States Patent [19]

Luitje

[11] Patent Number: 4,939,675
[45] Date of Patent: Jul. 3, 1990

[54] DIGITAL SYSTEM FOR CONTROLLING MECHANICAL INSTRUMENT GAUGES

[75] Inventor: William V. Luitje, Ann Arbor, Mich.

[73] Assignee: Chrysler Corporation, Highland Park, Mich.

[21] Appl. No.: 288,373

[22] Filed: Dec. 22, 1988

[51] Int. Cl.⁵ .............................................. G01F 3/48
[52] U.S. Cl. .................................. 364/550; 324/166; 364/565
[58] Field of Search ............... 364/550, 556, 565, 559, 364/561, 514, 131, 132, 138, 431.04, 431.12; 324/114, 115, 167, 82, 165, 166; 73/530; 340/870.16; 341/144, 151

[56] References Cited

U.S. PATENT DOCUMENTS

| | | | |
|---|---|---|---|
| 4,152,645 | 5/1979 | Bendler | 364/565 |
| 4,230,984 | 10/1980 | Taylor | 324/115 |
| 4,356,445 | 10/1982 | Congdon | 324/82 |
| 4,494,183 | 1/1985 | Bayer et al. | 324/115 |
| 4,506,216 | 3/1985 | Fukamachi et al. | 324/166 |
| 4,556,943 | 12/1985 | Pauwels et al. | 364/431.04 |
| 4,567,466 | 1/1986 | Bogarth et al. | 324/115 |
| 4,587,605 | 5/1986 | Kouyama et al. | 364/131 |
| 4,608,532 | 8/1986 | Ibar et al. | 364/556 |
| 4,628,314 | 12/1986 | Morinaga et al. | 324/165 |
| 4,751,442 | 6/1988 | Kurakake | 364/131 |
| 4,777,618 | 10/1988 | Nakano et al. | 364/431.04 |
| 4,779,213 | 10/1988 | Luitje | 364/565 |
| 4,791,569 | 12/1988 | Suzuki | 364/431.04 |

Primary Examiner—Kevin J. Teska
Attorney, Agent, or Firm—Wendell K. Fredericks

[57] ABSTRACT

A firmware/hardware apparatus for controlling with digital signals the smooth operation of a needle of an electronic analog gauge meter even when the measurand data is provided intermittently.

4 Claims, 2 Drawing Sheets

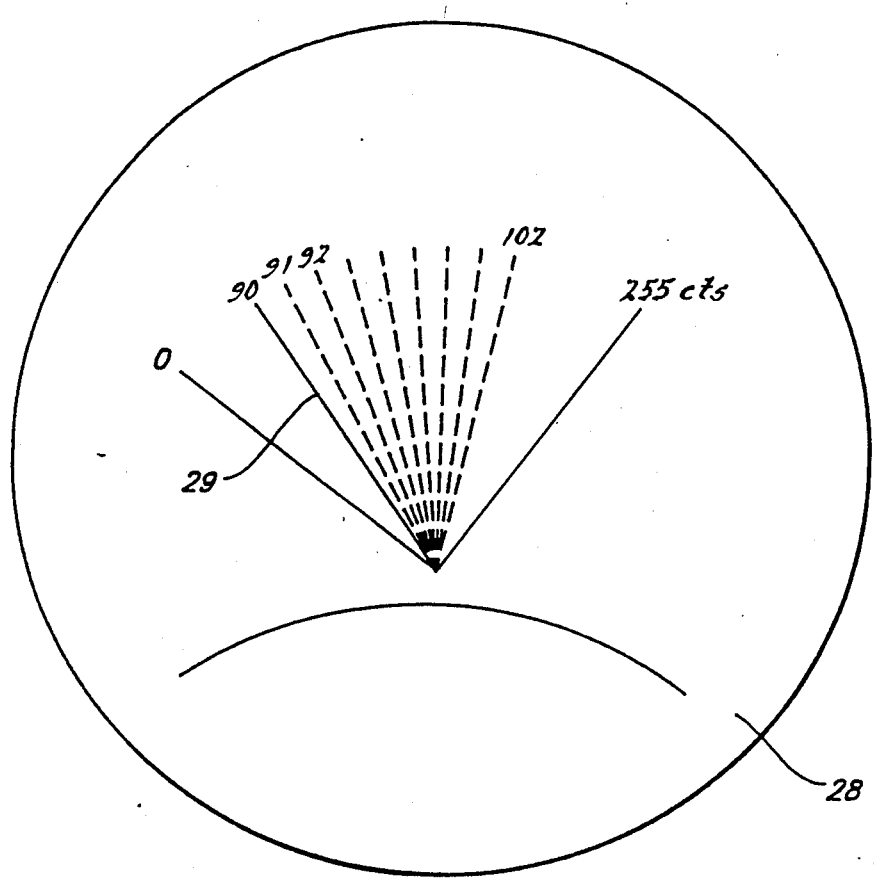
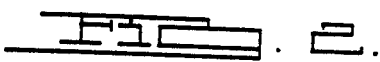

DIGITAL SYSTEM FOR CONTROLLING MECHANICAL INSTRUMENT GAUGES

BACKGROUND OF THE INVENTION

1. Field of the Invention

The present invention relates generally to techniques for operating mechanical instrument gauges using digital information derived from measurements of physical quantities broadcast over a serial communications link, and more particularly, to improved techniques which permit interfacing analog gauges to a digital communication system that broadcasts measurands as numbers during defined intervals over a serial data link to intelligent devices that share time on the link, the intelligent devices have circuits that use measurands as numbers for controlling the operation of the analog gauges.

2. Description of the Prior Art

In prior art vehicle serial digital communications systems, digital signals control digital speedometers very effectively by processing numerical data representing measured physical quantities as disclosed in U.S. Pat. No. 4,779,213 which issued Oct. 18, 1988 to the present inventor, William Luitje.

In vehicles equipped with serial data links for data communication, intelligent devices use the same sensed measurands for updating digital instrument clusters; however, having just digital instrument clusters working with serial data links, restricts the buying public's choice of display devices. Many consumers, who prefer analog instrument clusters, may desire to own a vehicle equipped with advanced digital electronic features that utilize digital data transmission links but do not want the digital electronic instrument cluster which accompanies it. Some desire to replace the digital instrument cluster with an analog mechanical instrument cluster. But due to the lack of compatibility, an analog mechanical instrument cluster usually cannot directly replace the digital electronic instrument cluster. Although having separate data lines may permit effecting the substitution, this increases cost, design and manufacturing complexity.

Additional problems exist when trying to substitute an analog gauge for a digital gauge in a vehicle that utilizes a digital data communications system for controlling an instrument panel. To use digital signals to drive electrically controlled analog gauges, some form of digital to analog (D/A) converting device must provide the interface between the digital input signals and the analog gauge movement. Such converting device may take the form, e.g. of H-drive circuits having logic controlled current sink and source devices for driving gauge coil windings appropriately to effect correlative gauge indications.

In vehicles that use digital communications systems, transmission of number representation of measurands seldom occurs continuously. This is because the amount of information that can be communicated over the link is limited by the bandwidth of that link. Other modules in the system also need to use the link to communicate with each other. Also, each module has other tasks to accomplish and cannot spend all its time communicating. For example, in the process of measuring speed, electrical pulse signals from a distance sensor become interrupt signals of a measuring computer. The measuring computer counts the number of distance sensor pulses within a discrete interval to determine vehicle speed. Then the measuring computer normally broadcasts the speed information over a data link to other computer controlled devices on the link such as an electronically controlled instrument cluster at a predetermined time interval.

At this point, a problem becomes apparent. If, e.g., the speed changes between data transmissions, gaps develop in the information transmitted to the speedometer. Such a gap, if allowed to persist, would cause the gauge needle to jump from one position to the next almost instantaneously and then oscillate briefly due to the under-damped quality of the gauge. This sort of needle movement is hard to read, distracting and differs from what people are accustomed to in an automotive instrument gauge; hence, it is totally unacceptable.

Hence, a search took place to find means which would cause analog gauge needle deflections to behave normally in a digital control system setting yet provide accurate meter indications of the measurands. This search resulted in the distributed data measuring, communications, and display system that embodies the principles of the present invention.

SUMMARY OF THE INVENTION

As a solution to these problems, the instant invention comprises a firmware/hardware system which expands the capabilities of analog display gauges. More particularly, the invention comprises firmware/hardware techniques that enable interfacing analog gauges to a digital system that broadcasts measurands as numbers during defined intervals over a communication link. Firmware refers to instructions to control a microcontroller unit (MCU) which are permanently stored in read-only-memory (ROM). Hardware refers to the physical components and apparatus that make up the remainder of the system. Hardware includes the several microcontrollers, communication interface, H-driver, etc. A form of digital filtering removes visible discontinuities from the gauge movement which would otherwise be present due to the measurands being broadcast at defined intervals. Thus control signals are provided to the gauge which cause smooth deflections of the gauge needle to effect normal analog gauge behavior.

BRIEF DESCRIPTION OF THE DRAWING

The invention and its mode of operation will be more fully understood from the following detailed description when taken with the appended drawing figures in which:

FIG. 2 is illustrative of a change in deflection of an analog gauge needle from a current deflection position to a target deflection position as would be effected by the techniques of the present invention.

DETAIL DESCRIPTION OF A PREFERRED EMBODIMENT

Figure 1:
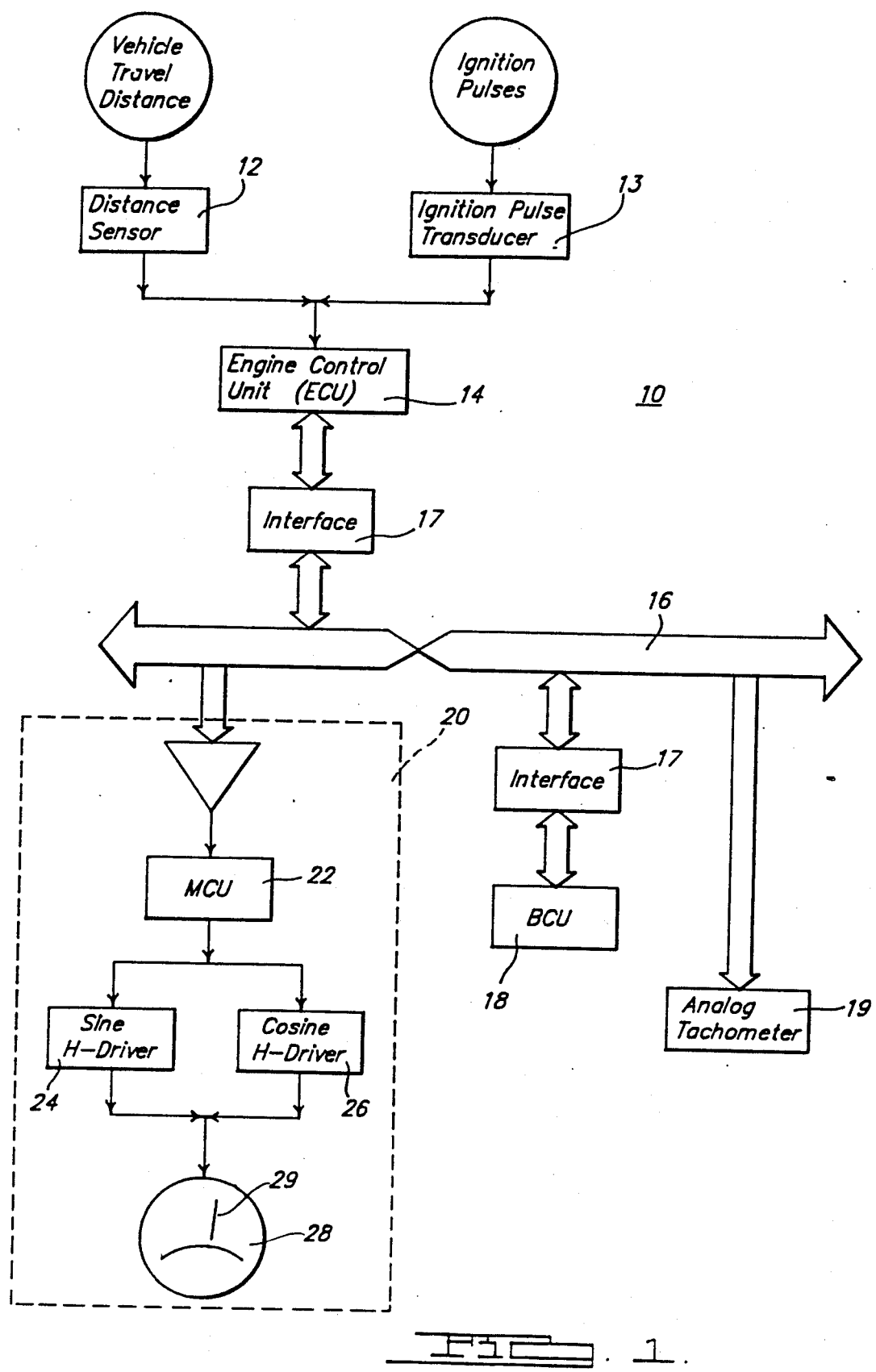
FIG. 1 is a partial pictorial, partial block diagram of a digital data communications network which sets the operating environment for the analog gauges in accordance with the invention.

Refer now to FIG. 1 which illustrates in block diagram form a preferred embodiment of a digital data communications network 10 used in vehicles with advanced electronic features that includes the analog gauges of this invention. Illustratively, a distance sensor 12, one of a plurality of transducers supplying a variety of data to an engine control unit (ECU 14), senses distance traveled by the vehicle. Another transducer such as an ignition pulse transducer 13 converts ignition pulse quantities into electrical signals equivalent to the number of engine crank shaft revolutions for determining RPM for use by an analog tachometer 19.

Since the analog tachometer in this embodiment employs an air-core gauge and functions basically in the same manner as the analog speedometer, and since the techniques of this invention apply to nearly any analog gauge adaptable to accept periodically computed or measured quantities, the description and application of the principles of the invention which follows will apply to operating an analog gauge as a speedometer.

Distance sensor 12, a conventional electromechanical transducer, usually mounted on a portion of a drive train of a vehicle, acts as a ground switch for providing a series of ON and OFF ground switch closures grounding a pull-up resistor at a defined in rate proportion to the distance traveled by the vehicle; e.g., 8000 switch closures per mile traveled, to an input port of a computer circuit (not shown) in ECU 14.

The computer circuit in ECU 14 increments a counter in response to each switch closure during a defined interval. At the end of that interval the count is transmitted over serial link 16 in a chosen message format. Since the counts are accumulated over a specific interval, the data can be interpreted as distance counts/time, or speed. The counts/time data in this embodiment consists of a message identification (ID) byte; i.e., an identification of the type parameter, and a data byte used to designate a digital number of a value proportional to the distance the vehicle traveled during a chosen time interval.

Conventional serial communication type transmitter/receiver devices within interface modules 17—17 and non-return-to-zero (NRZ) coding move data over link 16. However, other alternative codes such as NRZ inverted and Manchester coding may be used. The serial communication interfaces within the interface circuits convert standard digital logic level signals into, e.g., NRZ coded serial data for transmission over link 16.

Body controller unit 18 (BCU 18) in this embodiment, which intercepts the coded data broadcast by ECU 14 over link 16, processes and converts the distance/time number values into a coded message format usable by the D/A converting circuits within an analog speedometer 20. Then, within chosen transfer intervals, BCU 18 transmits coded messages to speedometer 20 at a rate suitable for updating an analog air-core gauge 28.

A message sent over link 16 by BCU 18 to analog speedometer 20 comprises an identification byte, a data 0 byte and a data 1 byte. A byte in this embodiment comprises a start bit, eight (8) data bits and one (1) stop bit. Prior to the transmission of the message, at least ten (10) bit times of idle (a high logic voltage level) are maintained on link 16. Then separate messages transmitted sequentially provide data for each analog gauge connected to link 16. The idle periods separate each message.

Analog speedometer 20, which interfaces directly with link 16, intercepts the messages transmitted from BCU 18 at a rate of 7812.5 bits per second and then performs the process of converting the data into a form usable for updating the analog gauges such as gauge 28. It should be appreciated by those skilled in this art that other analog display mechanisms could be used instead of the air-core gauge, e.g., a stepper motor driven indicator gauge.

CONSTRAINTS IMPOSED ON THE SYSTEM

Before explaining data procurement gap, transmission gap and needle movement smoothing procedures, the following provides a listing of the various constraints imposed on system 10. Firstly, the microprocessor located in ECU 14 has limitations imposed on the time used to procure distance data supplied to analog speedometer 20. Hence, ECU 14 transmits speed data over link 16 only during certain communication transfer intervals. Secondly, link 16, essentially a twisted pair of wires, has bandwidth limitations. Signal data rates over link 16 cannot exceed 10 kilobits/second. Thirdly, analog speedometer 20 requires continuous updating as the vehicle travels. Thus, the system must provide information to gauge 28 at an update rate that effects needle movement in a manner that the user can easily follow. Fourthly, smooth needle movement must occur without the needle sticking during translation even though the hardware circuits within the system do not address or aid smooth needle movement considerations. Fifthly, the design of the air-core gauge movement provides little mechanical damping in order to allow quick needle movement.

To appreciate these constraints, assume that 8000 switch closures or counts equals one (1) mile of vehicle travel. ECU 14 counts the switch closures and transmits, synchronously, an accumulation of the counts or distance data over link 16 within, e.g., a 344 ms interval to BCU 18.

Then BCU 18 translates the accumulated counts/time data into mi/hr data using a conversion factor as follows:

$$\frac{\text{dist. cnts.}}{0.344 \text{ sec.}} * \frac{\text{mile}}{8000 \text{ dist. cnts.}} * \frac{3600 \text{ sec.}}{\text{hours}} = 1.30814 \text{ mi/hr} \quad (1)$$

Another conversion factor permits converting the mph values obtained into gauge needle deflection counts. The analog gauge in this embodiment responds to a number or a count equivalent to a percent of full deflection of the gauge needle. For example, FIG. 2, illustrates a 90° gauge wherein speed ranges from 0 to 85 mph and input count numbers range from 0 to 255. It should be appreciated by those skilled in this art that the principles of this invention would apply to gauges capable of providing a maximum deflection from 0° to at least 360°. A microcontroller (MCU) 22 of analog speedometer 20 converts digital numbers into pulse-width modulated signals which drive H-drivers 24 and 26 for deflecting the needle of gauge 28 to a location proportional to the percentage that the number represents with respect to the number 255. Full deflection equals 255; no deflection equals zero. This other conversion factor follows:

$$\frac{90°}{85 \text{ mph}} * \frac{255 \text{ deflection counts}}{90°} = \frac{3 \text{ deflection counts}}{\text{mph}} \quad (2)$$

Hence, by multiplying the mph values calculated by using the technique of equation 1 by the conversion factor in equation 2, the mph values will be converted into deflection counts usable by MCU 22 of analog speedometer 20.

This algorithm produces smooth needle movement by keeping track of the current needle deflection and the desired (or target) deflection based on an update number, Delta. It then moves the gauge needle linearly from its current position to the target position at a rate dictated by a Delta number at a chosen update rate. This update rate is chosen, taking into account the desired characteristic of needle movement, for the particular gauge being driven. If the magnitude of gauge movement can be large in one data update period, then the update rate must be fast to create the illusion of smooth gauge movement. Slowly changing gauges, such as a fuel gauge, can utilize a much slower update rate. The updating number Delta is defined as follows:

$$\text{Delta} = \left( \frac{\text{target deflection} - \text{current deflection}}{\text{update rate} * \text{data rate} * \text{smoothing factor}} \right) \quad (3)$$

The data rate, in this embodiment, 0.344 second, equals the rate at which new distance counts are received by BCU 18. The smoothing factor number permits introducing additional needle damping. The more the smoothing factor number exceeds one, the more the damping increases. In this embodiment, the smoothing factor is one. The update rate may vary from 8 Hz, if it is desired to conserve bus bandwidth, through 100 Hz, if extremely smooth gauge needle motion is desired. In the speedometer of this embodiment, the update rate is 32 Hz. Thus BCU 18 must perform two primary tasks concurrently, namely compute deflection and Delta values for gauge 28 at a frequency of about 3 Hz and also update the current deflection by Delta at a 32 Hz rate.

For a more detailed description of the implementation the above operations, Tables 1 and 2 contain pseudo code statements representative of the machine code instructions the processor of BCU 18 executes to compute mph data substantially free of gaps between integer time/count data transmitted over link 16 and in a form that minimizes jerkiness in the gauge needle.

The pseudo code statements, a form of program development language, provides a verbal picture of the program functions much like a flowchart. The assembly language statements (not shown) which implement the pseudo code statements may be compiled into a form commensurate with the target computer assembly language and optimized for execution speed and RAM or ROM efficiency as the system requirements dictate. A suitable conventional assembler is used to generate the machine codes. The machine codes generated from the pseudo code statements are stored in a chosen location in ROM and used in a control algorithm by BCU 18 to generate mi/hr data.

In the pseudo code statements, the asterisk * denotes the beginning of a statement, the dash after the asterisk indicates the indentation level of the statement and /*comment*/ defines a comment line.

TABLE 1

TARGET AND DELTA COUNT NUMBERS

/*Convert distance counts/time data byte words to Target Deflection and Delta count numbers */
/*A Target Deflection count number and Delta count number is determined once every period (i.e., one every 344 ms)
/*Definitions */
/*DISTANCE is the latest distance/time data received from ECU 14 */
/*DATA INTERVAL is the length of time between receipt of new raw data, 344 ms in this case*/
/*TARGET DEFLECTION is the position where the speedometer needle should be based on the latest DISTANCE, computed in this routine*/
/*CURRENT DEFLECTION is the current position of the TABLE 1-continued

TARGET AND DELTA COUNT NUMBERS speedometer needle, computed in the routine of Table 2*/
/*DELTA is an update number of CURRENT DEFLECTION that is computed in this routine based on TARGET DEFLECTION and CURRENT DEFLECTION*/
/*UPDATE RATE is the rate BCU 18 updates CURRENT DEFLECTION used in Table 1 and 2*/
/*SMOOTHING FACTOR is chosen during system design to provide proper damping*/
*While Ignition On, DO
*Wait for new DISTANCE byte to be sent from ECU 14;
*mph number = (DISTANCE) * 1.30814;
*TARGET DEFLECTION =
mph number * 3 deflection counts/mph;

$$*\text{DELTA} = \frac{\text{TARGET} - \text{CURRENT}}{\text{DEFLECTION} - \text{DEFLECTION}}\,;$$
$$\text{UPDATE RATE}*$$
$$\text{DATA INTERVAL}*$$
$$\text{SMOOTHING FACTOR}$$

*Save TARGET DEFLECTION;
*Save DELTA;
*End While *

TABLE 2

CURRENT DEFLECTION COUNT NUMBERS

*-While ignition of the vehicle ON, Do
*---Get TARGET DEFLECTION;
*---Get DELTA;
*---Wait for UPDATE RATE time;
*---If CURRENT DEFLECTION not = TARGET DEFLECTION
*-----CURRENT DEFLECTION = CURRENT DEFLECTION + DELTA;
*---Else
*-----Null;
*---If integer part of TARGET DEFLECTION has changed
*-----Transmit CURRENT DEFLECTION to analog speedometer 20;
*---Else
*-----Null;
*-End While;
End Program

OPERATION OF THE SYSTEM

As mentioned supra, to provide deflection numbers to analog meter 20, BCU 18 performs essentially two concurrent tasks, namely, computing TARGET DEFLECTION and Delta, and updating CURRENT DEFLECTION until CURRENT DEFLECTION equals TARGET DEFLECTION. Illustratively, to determine TARGET DEFLECTION, the BCU 18 must execute the program depicted in Table 1 and, to determine DELTA and CURRENT DEFLECTION, it must execute the program depicted in Table 2.

To illustrate the detailed operation of this system, Table 3 and FIG. 2 are provided. Table 3 is a record of the data flow and computations produced in the example operation of this system. Each line represents an event in the operation of the system with the first line showing the initial conditions of the example. Subsequent lines are arranged in chronological order with the first column showing the time at which each event happens. The lines represent two kinds of events. One is the transmission by ECU 14 and receipt by BCU 18 of the distance/time information which is used to compute speed. At this time the program of Table 1 is executed yielding the quantities Target Deflection and Delta. The second type of event happens every 1/32 second and at this time the program of Table 2 is executed resulting in an updated value for Current Deflection and the possible transmission of a new deflection command to the analog speedometer gauge 20.

For events of the first type, Table 3 shows the time of the event in the first column, the value of distance/time message received in the second column, the equivalent miles per hour of that message in the third column, and the values of Target Deflection and Delta computed at that time are shown in columns 4 and 5. For events of the second type, the time in thirty-seconds of a second is shown in the first column and the current deflection computed at that time is shown in the sixth column. The seventh column shows the value of deflection transmitted, if any. FIG. 2 shows the layout of the speedometer gauge used in this example and how the gauge needle moves in response to the deflection commands sent by BCU 18. The numbers above the intermediate needle positions indicate the deflection count value for that position. This figure is not drawn to scale with respect to the needle position since each deflection count is about ⅓ of a degree which would cause the needle positions to be drawn overlapped.

Table 3 illustrates the first second of operation of the case where a car has been travelling about 30 miles per hour so as to generate a steady stream of distance/time values of 23. At this point the needle is positioned at deflection count 90 and Delta is 0. The driver then accelerates steadily for a period of 5 seconds, reaching a speed of 50 miles per hour in that time.

At time zero BCU 18 receives the first distance/time value of the acceleration period, a value of 24. Using equations (1) and (2) as specified in Table 1 BCU 18 computes a Target Deflection of 94.2. This is simply $$94.2 = 24 * 1.30814 * 3 \quad (4)$$

Next, it computes Delta as specified in Table 1. In this first iteration the Target Deflection is 94.2 as we have just shown and the Current Deflection is 90 as specified by the initial conditions of the example. Update Rate is 32 and smoothing Factor is 1 for the analog speedometer; Data Interval is 0.344. This computation is $$0.3815 = \frac{94.2 - 90}{32 * 0.344} \quad (5)$$

For the next 11 thirty-seconds of a second the control program of Table 2 is executed. The Current Deflection is incremented by 0.3815 and a new deflection command is transmitted to the gauge whenever the integer part of Current Deflection changes. For example, at the third thirty-second of a second Current Deflection changes from 90.76 to 91.14 and a deflection command of 91 is transmitted to analog speedometer 20.

In this embodiment, as shown in FIG. 1, in response to the deflection command sent from BCU 18, analog speedometer 20 finds SINE and COSINE values for the deflection command and generates appropriate pulsewidth modulated signals to the SINE and COSINE H-drivers 24 and 26. These drivers generate currents commensurate with the pulsewidth modulated signals in the two orthogonal coils of air core gauge 28 which cause gauge pointer 29 to move to a new position. Referring now to FIG. 2, the needle will move from the position labeled 90 to the position labeled 91.

The needle will be moved 3 more times in the first interval. Then a new distance/time message is received from ECU 14, and, as a result, a new Target Deflection and Delta are computed and the process of incrementing Current Deflection is started again.

For gauge applications where the needle does not change position very rapidly, the update rate can be lowered to 8 Hertz or even lower, thus conserving communications bus bandwidth.

TABLE 3

| Time | Distance Received | MPH | Target Deflection | Delta | Current Deflection | Deflection Transmitted |
|---|---|---|---|---|---|---|
| Initial Condition | 23 | 30.1 | 90.3 | 0.0000 | 90.00 | |
| 0.000 | 24 | 31.4 | 94.2 | 0.3815 | | |
| 1/32 | | | | | 90.38 | |
| 2/32 | | | | | 90.76 | |
| 3/32 | | | | | 91.14 | 91 |
| 4/32 | | | | | 91.53 | |
| 5/32 | | | | | 91.91 | |
| 6/32 | | | | | 92.29 | 92 |
| 7/32 | | | | | 92.67 | |
| 8/32 | | | | | 93.05 | 93 |
| 9/32 | | | | | 93.43 | |
| 10/32 | | | | | 93.82 | |
| 11/32 | | | | | 94.20 | 94 |
| 0.344 | 25 | 32.7 | 98.1 | 0.3546 | | |
| 12/32 | | | | | 94.55 | |
| 12/32 | | | | | 94.91 | |
| 13/32 | | | | | 95.26 | 95 |
| 14/32 | | | | | 95.62 | |
| 15/32 | | | | | 95.97 | |
| 16/32 | | | | | 96.32 | 96 |
| 17/32 | | | | | 96.68 | |
| 18/32 | | | | | 97.03 | 97 |
| 19/32 | | | | | 97.39 | |
| 20/32 | | | | | 97.74 | |
| 21/32 | | | | | 98.10 | 98 |
| 22/32 | | | | | 98.45 | |
| 0.688 | 26 | 34.0 | 102.0 | 0.3223 | | |
| 23/32 | | | | | 98.77 | |
| 24/32 | | | | | 99.10 | 99 |
| 25/32 | | | | | 99.42 | |
| 26/32 | | | | | 99.74 | |
| 27/32 | | | | | 100.06 | 100 |
| 28/32 | | | | | 100.39 | |
| 29/32 | | | | | 100.71 | |
| 30/32 | | | | | 101.03 | 101 |
| 31/32 | | | | | 101.35 | |
| 32/32 | | | | | 101.68 | |
| 1.032 | 27 | 35.3 | 105.9 | 0.3838 | | |
| 33/32 | | | | | 102.06 | 102 |

A person skilled in the art may make various changes and substitutes to the layout of the parts, analog gauge mechanisms, parameter measured and the set of rules for processing data without departing from the spirit and scope of the invention.

I claim:

1. A firmware/hardware electronic analog meter control system used with a multi-measurand data communication system for measuring a chosen measurand and then moving a needle of a gauge of the meter in a manner analogous to changes in magnitude of the measurand to positions indicated by a series of integer numbers arranged linearly over a display scale of the gauge, the scale representing a range of magnitudes of the measurand from a minimum to a maximum value, the meter containing digital to analog conversion circuits and coil drivers for controlling needle movement, said system having a transducer arranged to sense the magnitude of the measurand, said system comprising:

(a) first computing means connected to the transducer for (1) receiving the magnitude of the measurand, (2) establishing a number in an internal storage memory corresponding to the magnitude of the measurand occurring during each period of a succession of measuring periods, (3) converting each number into an equivalent measurement unit, (4) converting each said measurement unit into a digital coded message format, and (5) thereafter producing at an output the digital coded message at an end of each counting period;

(b) communications means including an input transmitter/receiver device, a communications link and an output transmitter/receiver device said communications means having said input transmitter/receiver device connected to an output of said first computing means for sequentially sending each of said digital coded messages in a chosen format over said link at the end of each period; and (c) second computing means connected to said output transmitter/receiver device for (1) receiving each digital coded message, (2) converting each of said digital coded message into (i) a target deflection count and (ii) an update count from each of said digital coded messages, and thereafter computing a current deflection count using said target deflection and update counts, (3) incrementing said current deflection count by said update count at a chosen rate within each counting period of the measurand to establish a series of new current deflection counts such that each new current deflection count has an integer and a fractional part, and (4) upon the occurrence of a change of the integer part, producing at an output terminal another digital coded message that routes over said communications means to the meter, the meter containing a digital to analog converting circuit that responds to said another coded message to effect a deflection change of the needle.

2. Apparatus of claim 1 wherein said current deflection count is the current position of the needle, wherein the target deflection count represents a position where the needle should be based on the latest message from said first computing means and wherein the update count is a DELTA value.

3. Apparatus of claim 2 wherein said DELTA value is computed in said second computing means by dividing the difference between said target deflection count and the current deflection count by the product of an update rate, the counting period of switch closures and a smoothing factor; the update rate being a maximum rate for updating the needle movement and the smoothing factor being a needle damping value.

4. Apparatus of claim 3 wherein said first computing means is a first microcontroller means, and wherein said second computing means is a second microcontroller means.

* * * * *